(12) United States Patent
Lee et al.

(10) Patent No.: US 8,120,042 B2
(45) Date of Patent: Feb. 21, 2012

(54) SEMICONDUCTOR LIGHT EMITTING DEVICE

(75) Inventors: Sang Youl Lee, Gwangju (KR); Sung Kyoon Kim, Gwangju (KR); Hee Seok Choi, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 163 days.

(21) Appl. No.: 12/506,771

(22) Filed: Jul. 21, 2009

(65) Prior Publication Data
US 2010/0019251 A1    Jan. 28, 2010

(30) Foreign Application Priority Data

Jul. 22, 2008    (KR) .................. 10-2008-0071346

(51) Int. Cl.
*H01L 33/00* (2010.01)

(52) U.S. Cl. .................. 257/79; 257/E33.001

(58) Field of Classification Search .................. 257/79, 257/E33.001; 438/22
See application file for complete search history.

(56) References Cited

U.S. PATENT DOCUMENTS

| | | |
|---|---|---|
| 2003/0104678 A1 | 6/2003 | Kelly et al. |
| 2005/0202596 A1 | 9/2005 | Fukuyo et al. |
| 2006/0246687 A1 | 11/2006 | Kaiser et al. |
| 2006/0246688 A1 | 11/2006 | Sekiguchi et al. |
| 2007/0287267 A1 | 12/2007 | Sakamoto et al. |
| 2009/0236324 A1 | 9/2009 | Fukuyo et al. |

*Primary Examiner* — Cuong Q Nguyen
*Assistant Examiner* — Tran Tran
(74) *Attorney, Agent, or Firm* — Saliwanchik, Lloyd & Eisenschenk

(57) ABSTRACT

A semiconductor light emitting device is provided. The semiconductor light emitting device comprises a substrate and a light emitting structure. The substrate comprises a plurality of discontinuous fusion spots on at least one side surface thereof. The light emitting structure comprises a plurality of compound semiconductor layers on the substrate.

18 Claims, 6 Drawing Sheets

SEMICONDUCTOR LIGHT EMITTING DEVICE

CROSS-REFERENCE TO RELATED APPLICATIONS

This application claims the benefit under 35 U.S.C. §119 of Korean Patent Application No. 10-2008-0071346, filed Jul. 22, 2008, which is hereby incorporated by reference in its entirety.

BACKGROUND

Embodiments relate to a semiconductor light emitting device.

Group III-V nitride semiconductors have been variously applied to optical devices comprising blue and green Light Emitting Diodes (LED), high-speed switching devices such as a Metal Semiconductor Field Effect Transistor (MOSFET) and a Heterojunction Field Effect Transistor (HFET or HEMT), and light sources such as an illumination or display device. In particular, a light emitting device using a group III nitride semiconductor has a direct transition band gap corresponding to the range between visible rays and ultraviolet rays, realizing highly efficient light emission.

Nitride semiconductors are mainly used for LEDs or Laser Diodes (LD). Studies on ways of improving manufacturing processes and optical efficiency are being carried out.

BRIEF SUMMARY

Embodiments provide a semiconductor light emitting device comprising a plurality of discontinuous fusion spots on at least one side surface of a substrate.

Embodiments provide a semiconductor light emitting device comprising a plurality of fusion spots arranged on at least one side surface of a substrate at a predetermined interval.

Embodiments provide a semiconductor light emitting device comprising a plurality of fusion spots that occupy less than about 15% of the total area of one side surface of a substrate.

Embodiments provide a semiconductor light emitting device comprising a plurality of fusion spots formed in a discontinuous dotted pattern on one of the center, the upper end, and the lower end of a side surface of a substrate.

Embodiments provide a semiconductor light emitting device comprising a plurality of fusion spots discontinuously formed, and a roughness branched from the fusion spots.

An embodiment provides a semiconductor light emitting device comprising: a substrate comprising a plurality of discontinuous fusion spots on at least one side surface thereof; and a light emitting structure comprising a plurality of compound semiconductor layers on the substrate.

An embodiment provides a semiconductor light emitting device comprising: a substrate comprising a plurality of discontinuous fusion spots arranged at a predetermined interval on at least one side surface thereof; and a plurality of compound semiconductor layers on the substrate.

An embodiment provides a semiconductor light emitting device comprising: a substrate comprising a plurality of discontinuous fusion spots comprising a dotted pattern on at least one side surface thereof; and a light emitting structure comprising a plurality of compound semiconductor layers on the substrate.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the following description, it will be understood that when a layer or film is referred to as being 'on' another layer or substrate, it may be directly on the another layer or substrate, or intervening layers may also be present. Further, it will be understood that when a layer is referred to as being 'under' another layer, it may be directly under the another layer, or one or more intervening layers may also be present. In addition, it will also be understood that when a layer is referred to as being 'between' two layers, it may be the only layer between the two layers, or one or more intervening layers may also be present.

Figure 1:
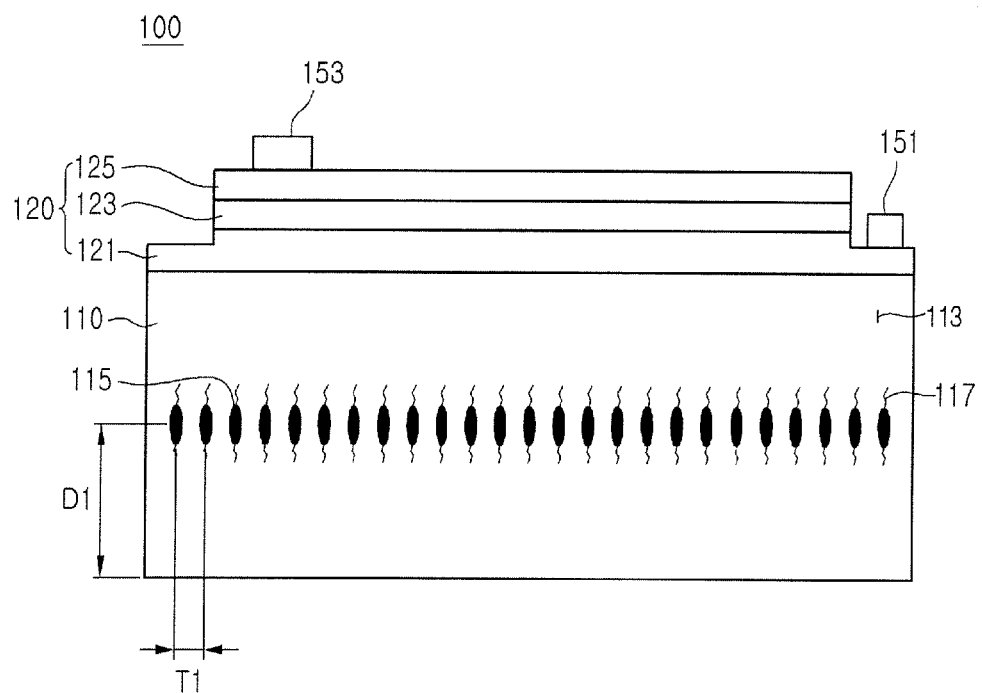
FIG. 1 is a cross-sectional view illustrating a semiconductor light emitting device according to a first embodiment.

FIG. 1 is a cross-sectional view of a semiconductor light emitting device according to an embodiment.

Referring to FIG. 1, a semiconductor light emitting device 100 comprises a substrate 110 and a light emitting structure 120.

The substrate 110 may comprise a sapphire substrate ($Al_2O_3$) or a transparent substrate like glass. Also, the substrate 110 may be GaN, SiC, ZnO, Si, GaP, GaAs, $Ga_2O_3$, a growing type substrate, an insulation substrate, or a conductive substrate. Hereinafter, a sapphire substrate is taken as an example in this embodiment. An unevenness pattern may be formed on the surface of the substrate 110.

A plurality of fusion spots 115 are formed on at least one side surface 113 of the substrate 110 in a discontinuous point pattern. The fusion spots 115 may be formed on one side, two sides, or all side surfaces of the substrate 110. The plurality of fusion spots 115 are horizontally arranged at a predetermined interval T1 along the side surface 113 of the substrate 110. Here, the interval T1 may be about 10 μm, or may range from about 7.5 μm to about 15 μm.

The formation position of the fusion spot 115 may be formed to have a predetermined height D1 or depth from a lower end of the substrate 110. The height D1 may fall within about 30% to 70% of the thickness of the substrate 110, based on the lower end of the substrate 110. Here, the thickness of the substrate 110 may be from about 100 μm to about 150 μm.

An area of each side surface 113 that the plurality of fusion spots 115 occupy may fall within about 15% of the total area of the side surface 113. Also, the area that the plurality of fusion spots 115 occupy may fall within about 4% of the total surface area of the semiconductor light emitting device 100.

A roughness 117 is disposed on the side surface 113 of the substrate 110. The roughness 117 is branched from the fusion spot 115 on the side surface 113 of the substrate 110 in a crack shape. When the roughness 117 is formed at each fusion spot 115, an interval of the plurality of roughnesses 117 may be identical to the interval T1 of the fusion spots 115, but is not limited thereto.

The roughness 117 may be branched from some or all fusion spots in a crack shape. The branched directions may be identical to or different from each other.

The roughness 117 may be formed in an irregular direction from the fusion spot 115. For example, the branched direction may be perpendicular or oblique, but is not limited thereto. The shape and size of the roughness 117 may be identical to or different from each other, which may be modified within the scope of the embodiment.

A plurality of group II to VI compound semiconductor layers may be formed on the substrate 110 in a pattern form or in a layer shape. Also, a buffer layer and/or an undoped semiconductor layer may be formed on the substrate 110. The buffer layer may be selected from group III-V compound semiconductors, for example, GaN, AlN, AlGaN, InGaN, InN, InAlGaN, AlInN, AlGaAs, GaP, GaAs, GaAsP and AlGaInP, which may reduce a difference of the lattice constant between the substrate and compound semiconductor. The undoped semiconductor layer may be implemented using an undoped GaN-based semiconductor, but is not limited thereto.

A light emitting structure 120 is formed on the substrate 110. The light emitting structure 120 may be implemented in one of an N-P junction, a P-N junction, an N-P-N junction and a P-N-P junction using group III-V compound semiconductor layers.

The light emitting structure 120 comprises, for example, a first conductive semiconductor layer 121, an active layer 123, and a second conductive semiconductor layer 125.

The first conductive semiconductor layer 121 may be formed on the substrate 110.

The first conductive semiconductor layer 121 may be selected from the compound semiconductors of group III-V elements doped with a first conductive dopant, which may comprise, for example, GaN, AlN, AlGaN, InGaN, InN, InAlGaN, AlInN, AlGaAs, GaP, GaAs, GaAsP and AlGaInP. When the first conductive semiconductor layer 121 is an N-type semiconductor layer, the first conductive dopant comprises an N-type dopant such as Si, Ge, Sn, Se and Te. The first conductive semiconductor layer 121 may serve as an electrode contact layer, and may be formed in a mono-layer or multi-layer, but is not limited thereto.

The active layer 123 may be formed in a single quantum well structure or in a multiple quantum well structure. The active layer 123 may comprise, for example, $In_xAl_yGa_{(1-x-y)}N$ well layer/$In_aAl_bGa_{(1-a-b)}N$ barrier layer periodically stacked using the compound semiconductor material of group III-V elements ($0 \leq x \leq 1$, $0 \leq y \leq 1$, $0 \leq x+y \leq 1$, $0 \leq a \leq 1$, $0 \leq b \leq 1$, $0 \leq a+b \leq 1$). The conductive clad layer may be disposed on and/or under the active layer 123. The conductive clad layer may be formed of an AlGaN-based semiconductor. Also, the uppermost barrier layer of the active layer may have a concentration of an n-type or p-type impurity that is different from the lowest barrier layer or may not have an n-type impurity.

The second conductive semiconductor layer 125 is formed on the active layer 123. The second conductive semiconductor layer 125 may be selected from the compound semiconductors of group III-V elements doped with a second conductive dopant, which may comprise, for example, GaN, AlN, AlGaN, InGaN, InN, InAlGaN, AlInN, AlGaAs, GaP, GaAs, GaAsP and AlGaInP. When the second conductive semiconductor layer 125 is a P-type semiconductor layer, the second conductive dopant comprises a P-type dopant such as Mg and Ze. The second conductive semiconductor layer 125 may serve as an electrode contact layer, and may be formed in a mono-layer or multi-layer, but is not limited thereto.

In the light emitting structure 120, the first conductive semiconductor layer 121 may be formed of a P-type semiconductor, and the second conductive semiconductor layer 125 may be formed of an N-type semiconductor. A third conductive semiconductor layer (not shown), for example, an N-type semiconductor layer or a P-type semiconductor layer may be formed on the second conductive semiconductor layer 125. Thus, the light emitting structure 120 may comprise at least one of an N-P junction, a PN junction, an N-P-N junction and a P-N-P junction structure.

At least one layer of the light emitting structure 120 may be formed of a semiconductor material having a composition formula, $In_xAl_yGa_{1-x-y}N$ ($0 \leq x \leq 1$, $0 - y \leq 1$, and $0 \leq x+y \leq 1$), but is not limited thereto. Here, in the light emitting structure 120, different semiconductor layers may be disposed on and/or under the first conductive semiconductor layer 121, the active layer 123, and the second conductive semiconductor layer 125.

A second electrode layer (not shown) may be disposed on the second conductive semiconductor layer 125 or a third conductive semiconductor layer (not shown). The second electrode layer comprises at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO and a metallic oxide, but is not limited thereto.

The second electrode layer may be formed of Ag, Ni, Al, Rh, Pd, Ir, Ru, Mg, Zn, Pt, Au, Hf, or a combination of any of them.

A first electrode 151 may be disposed on the first conductive semiconductor layer 121, and the second electrode 153 may be disposed on the second conductive semiconductor layer 125 and/or the second electrode layer.

Here, a formation area of the first conductive semiconductor layer 121 for the first electrode 151 may be exposed by a mesa etching process. The mesa etching process may be performed along the circumference of the light emitting structure 120, or may be performed to expose a part of the semiconductor layer.

The plurality of fusion spots 115 on the side surface 113 of the substrate 110 may be formed in a minimum size and area to improve light extraction efficiency. That is, because a light does not penetrate the fusion spot 115 but is absorbed by the fusion spot 115, light absorption may be minimized to improve external quantum efficiency by minimizing the size of the fusion spot 115.

The roughness 117 formed around the fusion spot 115 on the substrate 110 may change a critical angle of an incident light to allow the incident light to escape from the roughness 117.

In this embodiment, the fusion spot 115 on at least one side surface 113 of the substrate 110 may be removed through a dry and/or wet etching.

FIGS. 2 to 8 are views illustrating a process of manufacturing a semiconductor light emitting device according to a first embodiment of FIG. 1.

Figure 2:
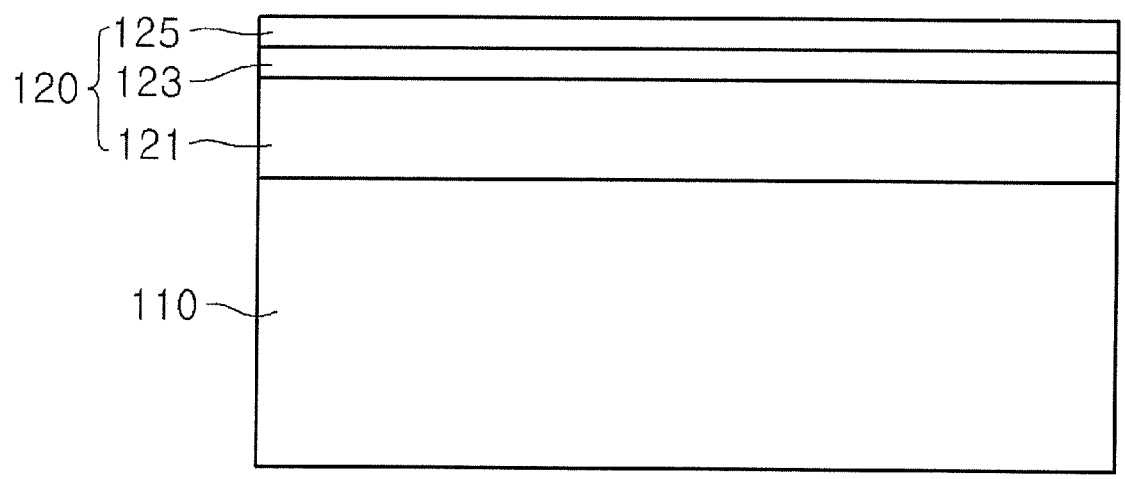
FIGS. 2 to 8 are views illustrating a process of manufacturing a semiconductor light emitting device according to a first embodiment of FIG. 1.

Referring to FIG. 2, a plurality of compound semiconductor layers may be formed on the substrate 110 using group II-VI compound semiconductors. The growth equipment of the plurality of compound semiconductor layers may comprise an electronic beam evaporator, a physical vapor deposition (PVD), a chemical vapor deposition (CVD), a plasma laser deposition (PLD), a dual-type thermal evaporator, sputtering, or a metal organic chemical vapor deposition (MOCVD), but is not limited thereto.

The substrate 110 may comprise a sapphire substrate ($Al_2O_3$) or a transparent substrate like glass. Also, the substrate 110 may be GaN, SiC and ZnO, Si, GaP, GaAs, $Ga_2O_3$, a growing type substrate, an insulation substrate, or a conductive substrate. Hereinafter, a sapphire substrate is taken as an example in this embodiment. An unevenness pattern may be formed on the surface of the substrate 110.

The plurality of group II to VI compound semiconductor layers may be formed on the substrate 110 in a pattern form or in a layer shape. Also, a buffer layer and/or an undoped semiconductor layer may be formed on the substrate 110. The buffer layer may be selected from group III-V compound semiconductors, for example, GaN, AlN, AlGaN, InGaN, InN, InAlGaN, AlInN, AlGaAs, GaP, GaAs, GaAsP and AlGaInP, which may reduce a difference of the lattice constant between the substrate and compound semiconductor. The undoped semiconductor layer may be implemented using an undoped GaN-based semiconductor, but is not limited thereto.

A light emitting structure 120 is formed on the substrate 110. The light emitting structure 120 may be implemented in one of an N-P junction, a P-N junction, an N-P-N junction and a P-N-P junction using group III-V compound semiconductor layers.

The light emitting structure 120 comprises, for example, a first conductive semiconductor layer 121, an active layer 123, and a second conductive semiconductor layer 125.

The first conductive semiconductor layer 121 may be formed on the substrate 110.

The first conductive semiconductor layer 121 may be selected from the compound semiconductors of group III-V elements doped with a first conductive dopant, which may comprise, for example, GaN, AlN, AlGaN, InGaN, InN, InAlGaN, AlInN, AlGaAs, GaP, GaAs, GaAsP and AlGaInP. When the first conductive semiconductor layer 121 is an N-type semiconductor layer, the first conductive dopant comprises an N-type dopant such as Si, Ge, Sn, Se and Te. The first conductive semiconductor layer 121 may serve as an electrode contact layer, and may be formed in a mono- or multi-layer, but is not limited thereto.

The active layer 123 may be formed in a single quantum well structure or in a multiple quantum well structure. The active layer 123 may comprise, for example, $In_xAl_yGa_{(1-x-y)}N$ well layer/$In_aAl_bGa_{(1-a-b)}N$ barrier layer periodically stacked using the compound semiconductor material of group III-V elements ($0 \leq x \leq 1$, $0 \leq y \leq 1$, $0 \leq x+y \leq 1$, $0 \leq a \leq 1$, $0 \leq b \leq 1$, $0 \leq a+b \leq 1$). The conductive clad layer may be disposed on and/or under the active layer 123. The conductive clad layer may be formed of an AlGaN-based semiconductor.

The second conductive semiconductor layer 125 is formed on the active layer 123. The second conductive semiconductor layer 125 may be selected from the compound semiconductors of group III-V elements doped with a second conductive dopant, which may comprise, for example, GaN, AlN, AlGaN, InGaN, InN, InAlGaN, AlInN, AlGaAs, GaP, GaAs, GaAsP and AlGaInP. When the second conductive semiconductor layer 125 is a P-type semiconductor layer, the second conductive dopant comprises a P-type dopant such as Mg and Ze. The second conductive semiconductor layer 125 may serve as an electrode contact layer, and may be formed in a mono- or multi-layer, but is not limited thereto.

In the light emitting structure 120, the first conductive semiconductor layer 121 may be formed of a P-type semiconductor, and the second conductive semiconductor layer 125 may be formed of an N-type semiconductor. The third conductive semiconductor layer (not shown), for example, an N-type semiconductor layer or a P-type semiconductor layer may be formed on the second conductive semiconductor layer 125. Thus, the light emitting structure 120 may comprise at least one of an N-P junction, a PN junction, an N-P-N junction and a P-N-P junction structure.

At least one layer of the light emitting structure 120 may be formed of a semiconductor material having a composition formula, $In_xAl_yGa_{1-x-y}N$ ($0 \leq x \leq 1$, $0 \leq y \leq 1$, and $0 \leq x+y \leq 1$), but is not limited there to. Also, the uppermost barrier layer of the active layer may have a concentration of an n-type or p-type impurity that is different from the lowest barrier layer or may not have an n-type impurity. Here, in the light emitting structure 120, different semiconductor layers may be disposed on and/or under the first conductive semiconductor layer 121, the active layer 123, and the second conductive semiconductor layer 125.

A second electrode layer (not shown) may be disposed on the second conductive semiconductor layer 125 or a third conductive semiconductor layer (not shown). The second electrode layer comprises at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO and a metallic oxide, but is not limited thereto. The second electrode layer may be formed of Ag, Ni, Al, Rh, Pd, Ir, Ru, Mg, Zn, Pt, Au, Hf, or a combination of any of them. The second electrode layer may be formed before or after the mesa etching, but is not limited thereto.

Figure 3:
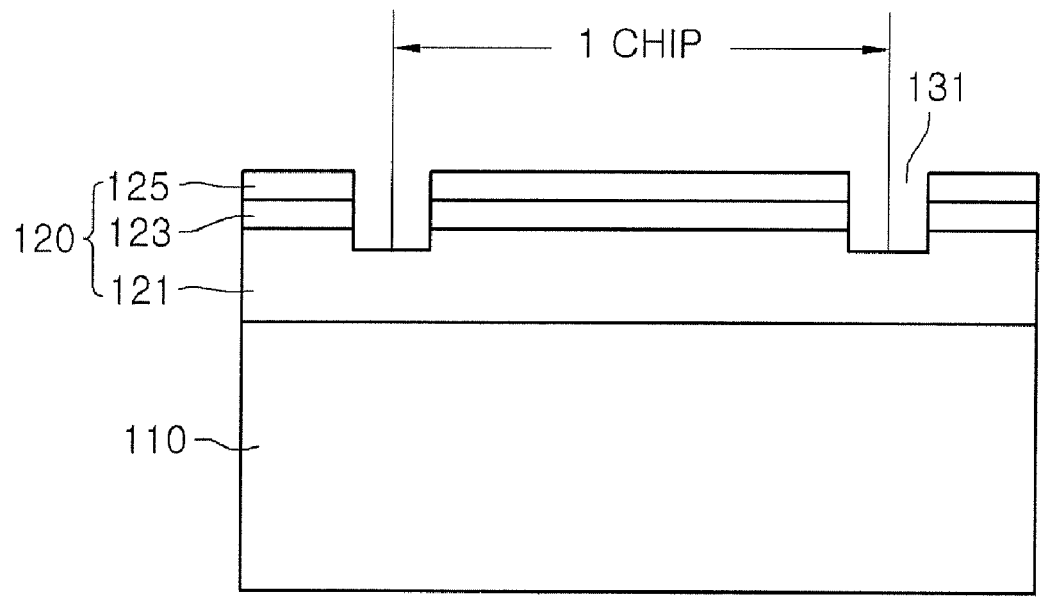

Referring to FIG. 3, a mesa etching is performed on the light emitting structure 120. The light emitting structure 120 is etched by a predetermined depth from the upper end the light emitting structure 120 along a boundary line of each chip. The etched region becomes a separation groove 131. The separation groove 131 may be formed to expose a part of the first conductive semiconductor layer 121. However, the separation groove 131 may be omitted.

Figure 5:
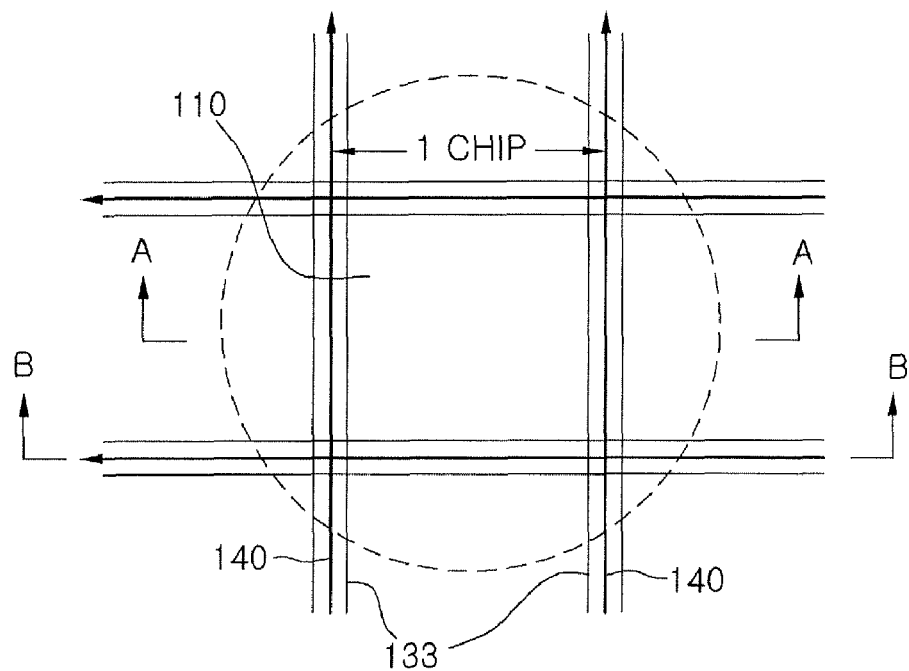

FIG. 5 is a plan view illustrating an exemplary irradiation of a laser light on a back surface of a substrate.

Figure 4:
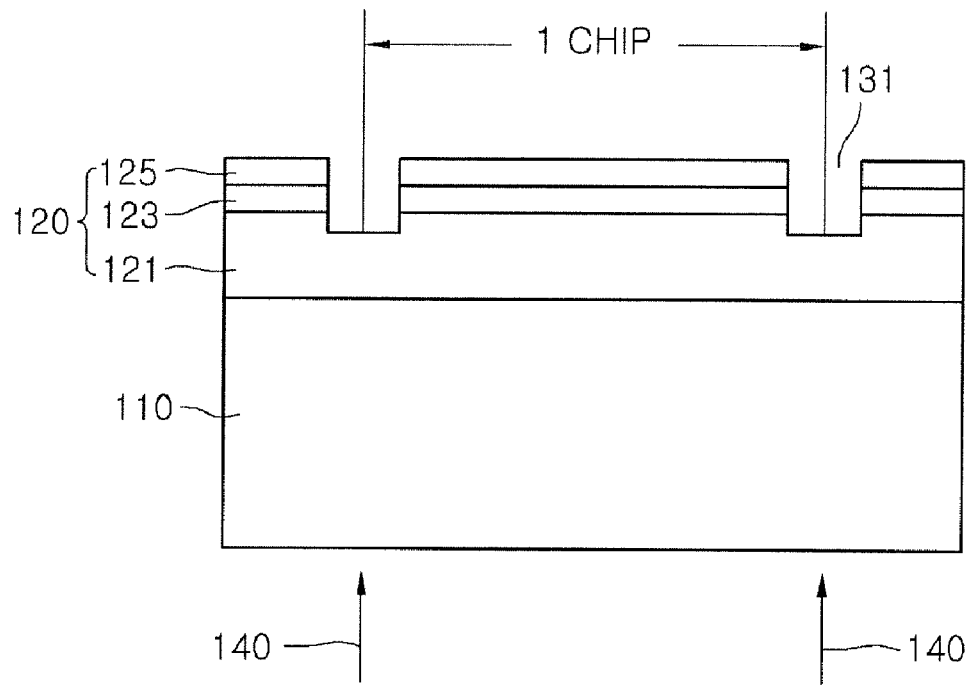

Referring to FIGS. 4 and 5, a laser light 140 is irradiated through the undersurface of a substrate 110. The laser light 140 is moved along a chip boundary line 133 while being irradiated through the undersurface of the substrate 110. If the laser light 140 is irradiated through the undersurface of substrate 110, the laser light 140 is focused on a light converging point. Here, when the thickness of the substrate 110 is thick, a polishing process may be performed. The thickness of the substrate 110 for the laser processing is from about 100 μm to about 150 μm.

When the laser light 140 is irradiated, a damage by a light absorption occurs in an internal light converging region of the substrate 110 and causes a fused region by thermal strain at the inner of the substrate 110. Also, a crack may be formed around some fused regions.

Since the laser light 140 is hardly absorbed to the undersurface of the substrate 110, a fusion phenomenon does not occur on the undersurface of the substrate 110. Hereinafter, the fusion region may be defined as a fusion spot, and the crack may be defined as a roughness.

The laser light 140 may be a semiconductor laser that may comprise, for example, an Nd:YVO laser. The wavelength of the laser light 140 may be about 355 nm, and the oscillation of the laser light 140 may be a Q-switch pulse. A repetition frequency may be 30 kHz, and a speed may be set to above 200 mm/sec. Here, the speed may be set from about 200 mm/sec to about 450 mm/sec.

Figure 6:
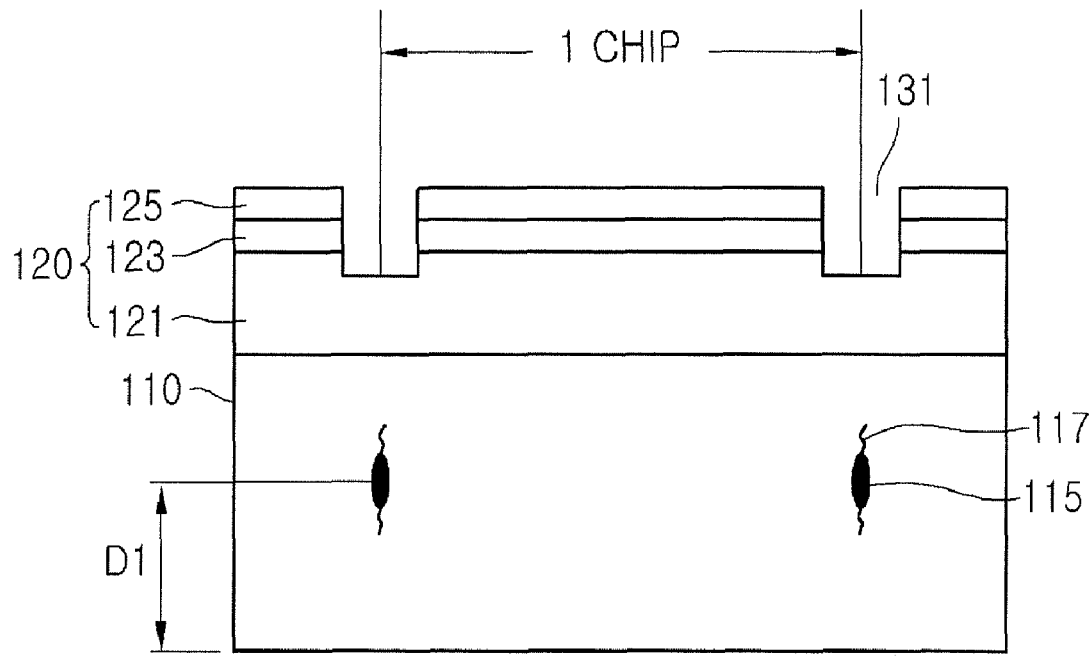
Figure 7:
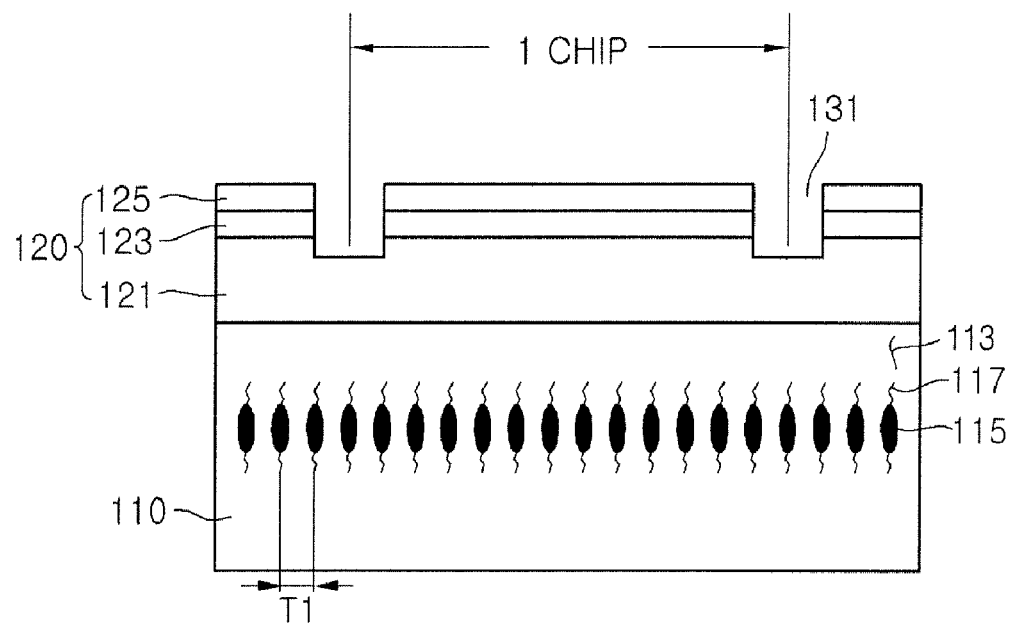

FIG. 6 is a cross-sectional view taken along a line A-A of FIG. 5, and FIG. 7 is a cross-sectional view taken along a line B-B of FIG. 5.

Referring to FIGS. 4 through 7, a plurality of light converging points are formed by a laser light 140 in an internal center region of the substrate 110. The plurality of light converging points form a plurality of fusion spots having a dotted pattern. Here, the height D1 of the light converging point may fall within about 30% to 70% of the thickness of the substrate 110, based on the lower end of the substrate 110.

The plurality of fusion spots 115 may be formed in the substrate 110 at a predetermined interval T1 along the chip boundary line 133. Because the plurality of fusion spots 115 are formed in a discontinuous dotted pattern in the substrate 110, fragments do not occur around the fusion spot of the substrate 110.

The interval T1 of the fusion spot 115 may be from about 7.5 μm to about 15 μm. As an example, the interval T1 of the fusion spot 115 of 10 μm may be a product of a repetition frequency 30 kHz and a speed 300 mm/sec of the laser light 140. The repetition frequency and/or the speed may vary with the interval of the plurality of fusion spots 115.

As the fusion spot 115 is formed at a predetermined interval on the side surface of the substrate 110, the region of the fusion spot 115 may occupy a minimum area on the side surface of the substrate 110.

The processing of the laser light 140 may be performed one or more times. Here, the number of irradiations and an irradiation direction (for example, to the top surface or the undersurface of the substrate 110) of the laser light 140 may be varied according to the thickness and the property of the substrate 110.

The laser light 140 may be irradiated along all chip boundary lines 133, or boundary lines of a plurality of chips. Thus, the plurality of fusion spots 115 may be horizontally formed in a discontinuous dotted pattern on all side surfaces or at least one side surface of the substrate 110 of each chip.

When the fusion spot 115 is formed in the substrate 110, a crack-like roughness 117 is formed around the fusion spot 115. The roughness 117 may be branched from all fusion spots or some fusion spots in a crack shape. Also, each roughness 117 may be branched in the same or different directions, and may be formed in a different shape or size, but is not limited to the above shape, size, and direction thereof.

Figure 8:
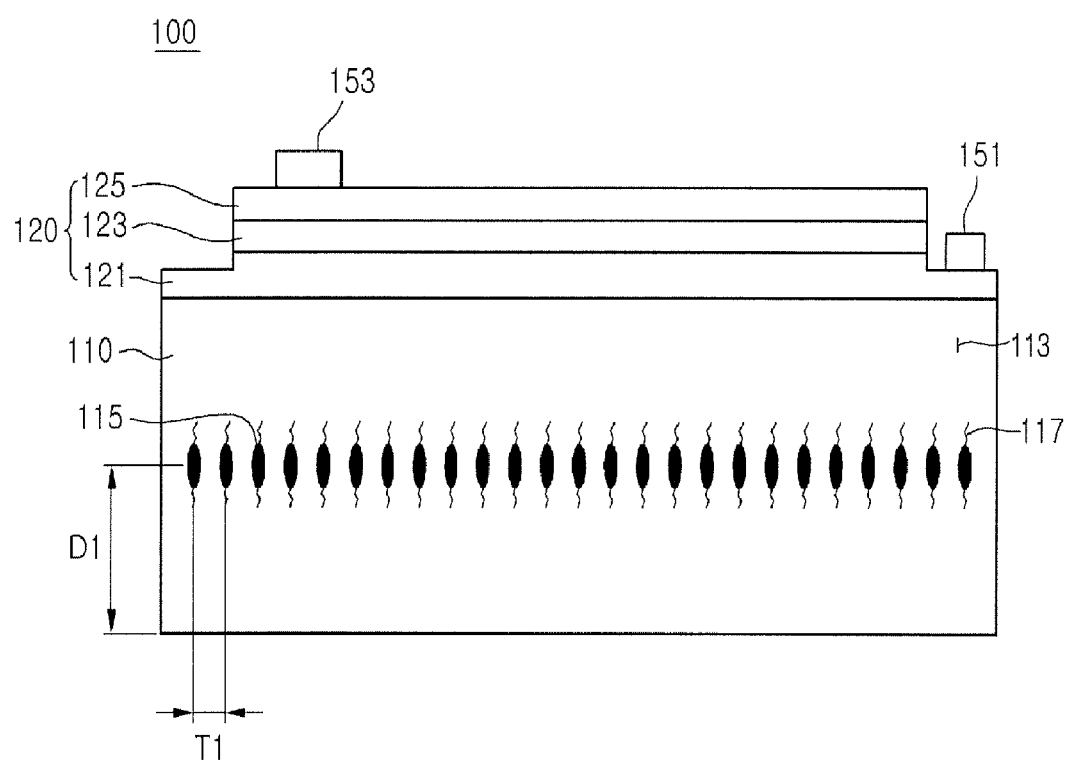

Referring to FIGS. 7 and 8, if the fusion spot 115 is formed in the substrate 110 according to a chip boundary line, the chip may be divided by applying a relatively small force along the chip boundary line. Thus, the chip may be divided without damaging a surface of the light emitting structure 120 and a lower end of the substrate 110.

The fusion spot 115 is arranged on at least one side surface 113 of the substrate 110 at a predetermined interval T1 to have a predetermined height or depth D1. An area that the fusion spots 115 formed on the side surface 113 of the substrate 110 occupy is within about 15% of the total area of the side surface of the substrate 110. The area that the fusion spots 115 occupy may be within about 4% of the total surface area of the semiconductor light emitting device 100. Thus, absorption of a light emitted from the light emitting structure 120 by the fusion spot 115 on the side surface 113 of the substrate 110 can be minimized. The roughness 117 formed on the side surface 113 of the substrate 110 may change the critical angle of an incident light to improve an external quantum efficiency.

The fusion spot 115 formed on the side surface 113 of the substrate 110 may not be removed. The above process may be complex, and may cause a damages and a yield decrease of the light emitting structure 120.

Since a fusion spot etching process is not performed in this embodiment, the light emitting structure 120 can be inhibited from being damaged, and a yield can be improved.

The fusion spot 115 formed on the side surface 113 of the substrate 110 may also be removed through a wet and/or dry etching process, which removes a light absorption region.

If a chip is separated along the chip boundary line, the first electrode 151 and the second electrode 153 may be formed on the first conductive semiconductor layer 121 and the second conductive semiconductor layer 125, respectively. The first electrode 151 and the second electrode 153 may be formed before the separation of the chip, but is not limited to the above electrode formation order.

In the first embodiment, since the plurality of fusion spots are discontinuously formed in dotted pattern on the side surface of the substrate of the semiconductor light emitting device, absorption of a light emitted from the light emitting structure may be minimized. Also, since the fusion spot on the side surface of the substrate may not be removed, the manufacturing process can be simplified. In addition, the external quantum efficiency can be improved using a roughness formed on the side surface of the substrate together with the fusion spot.

Figure 9:
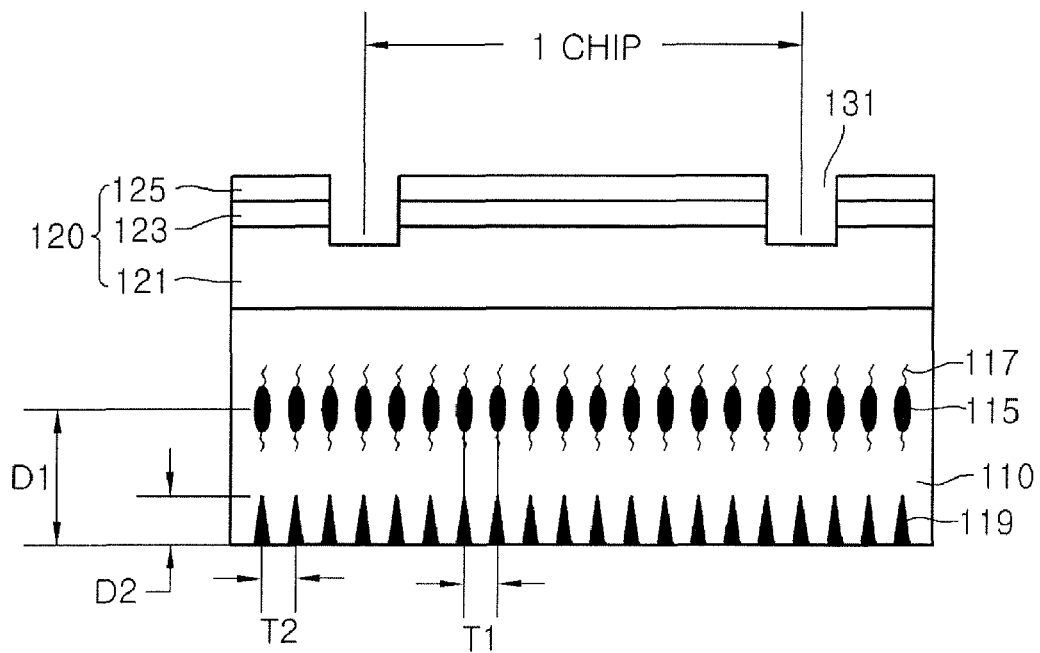
FIG. 9 is a cross-sectional view illustrating a process of manufacturing a semiconductor light emitting device according to a second embodiment.

FIG. 9 is a cross-sectional view illustrating a process of manufacturing a semiconductor light emitting device according to the second embodiment. To explain the second embodiment, repeated descriptions of parts identical to those of the first embodiment will be omitted.

Referring to FIG. 9, a plurality of first fusion spots 115 are discontinuously formed around the center of the substrate 110. A roughness 117 is branched from the first fusion spot 115. A plurality of discontinuous second fusion spots 119 having a predetermined depth D2 are formed around the lower end of the substrate 110. The first fusion spot 115 and the second fusion spot 119 may be formed at predetermined intervals T1 and T2 in a dotted pattern, respectively. The interval T1 of the plurality of the first fusion spots 115 may be from about 7.5 μm to about 15 μm, and the interval T2 of the plurality of the second fusion spots 119 may be from about 7.5 μm to about 15 μm. The intervals T1 and T2 may be identical to or different from each other.

In the above laser processing, the plurality of the second fusion spots 119 may be formed after the plurality of the first fusion spots 115 are formed in a discontinuous dotted pattern. The roughness 117 may be formed on all or some first fusion spots 115. A roughness (not shown) may be formed on all or some second fusion spots 119.

Since a laser light processing through the undersurface of the substrate 110 is performed at least two or more times, a chip may be separated by a smaller force.

Figure 10:
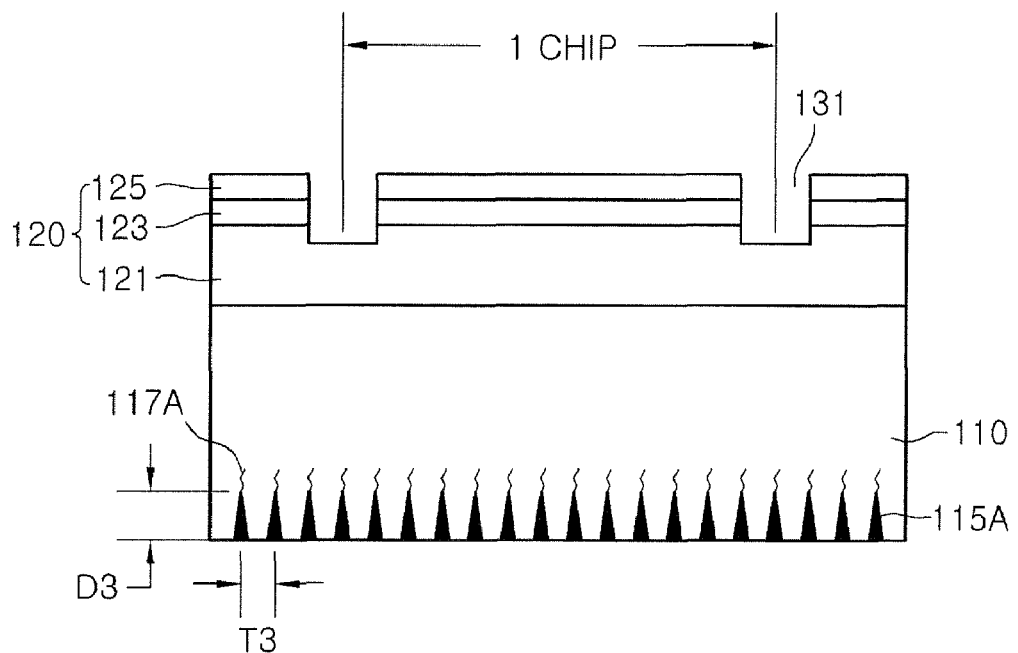
FIG. 10 is a cross-sectional view illustrating a process of manufacturing a semiconductor light emitting device according to a third embodiment.

FIG. 10 is a cross-sectional view illustrating a process of manufacturing a semiconductor light emitting device according to a third embodiment. To explain the third embodiment, repeated descriptions of parts identical to those of the first embodiment will be omitted.

Referring to FIG. 10, the plurality of third fusion spots 115A having a predetermined depth D3 are formed at the lower part of the substrate 110 in a discontinuous dotted pattern. The plurality of third fusion spots 115A are horizontally formed in the substrate 110 at a predetermined interval T3 (for example, from about 7.5 μm to about 15 μm), a roughness 117A may be formed on all or some the third fusion spots 115A. A laser light may be at least two or more times irradiated on the undersurface of the substrate 110.

Figure 11:
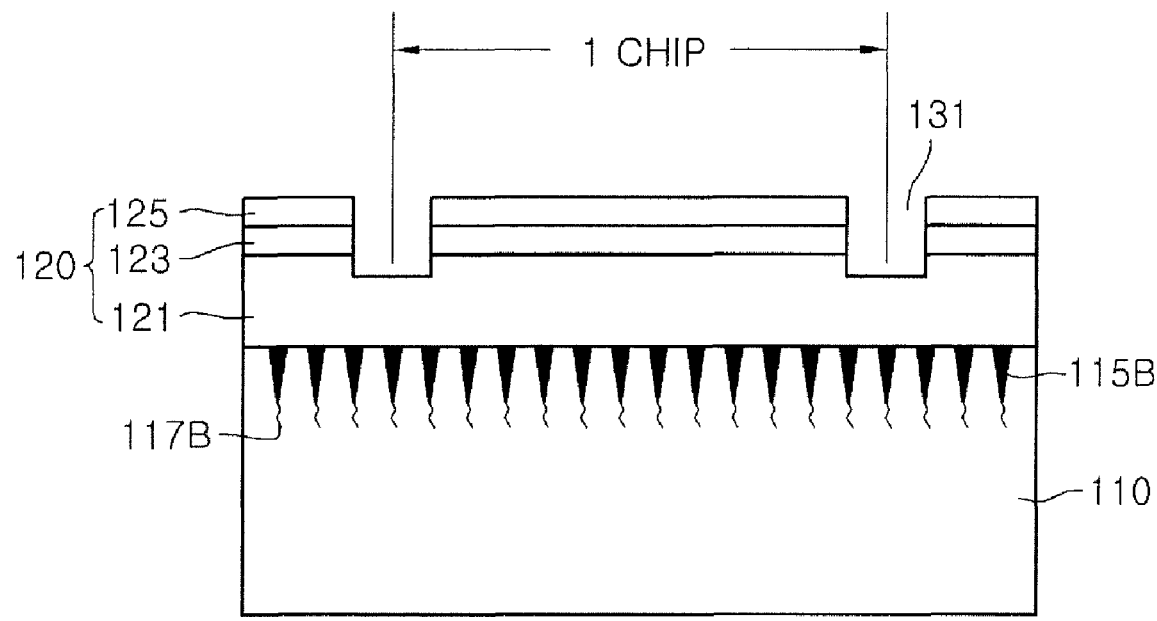
FIG. 11 is a cross-sectional view illustrating a process of manufacturing a semiconductor light emitting device according to a fourth embodiment.

FIG. 11 is a cross-sectional view illustrating a process of manufacturing a semiconductor light emitting device according to a fourth embodiment. To explain the fourth embodiment, repeated descriptions of parts identical to those of the first embodiment will be omitted.

Referring to FIG. 11, a laser light may be irradiated on a light emitting structure 120 of a substrate 110. According to the laser irradiation process, the plurality of the fourth fusion spots 115B having a predetermined depth are formed around the top end of the substrate 110 in a discontinuous dotted pattern. The plurality of the fourth fusion spots 115B may be formed at a predetermined interval (for example, from about 7.5 μm to about 15 μm) along the side surface of the substrate 110. The laser light may be irradiated at least two or more times.

Also, a roughness 117B branched from the fourth fusion spot 115B may be formed all or some the fourth fusion spots 115B.

In this case, a fifth fusion spot (not shown) may be formed in the substrate 110 at the same position as that of the first embodiment. The fifth fusion spot may be formed through an irradiation of a laser light through the undersurface of the substrate 110, or may be formed before the fourth fusion spot 115B is formed.

In an embodiment, a roughness may be formed on at least one side surface of a substrate to improve light extraction efficiency.

In an embodiment, a plurality of discontinuous fusion spots and a crack-like roughness may be formed to improve a yield of a semiconductor light emitting device without damaging a light emitting structure.

In an embodiment, a plurality of fusion spots are formed within about 15% area of a side surface of a substrate to reduce inconvenience of a manufacturing process caused by a removal of a fusion spot.

An embodiment provides a method of manufacturing a semiconductor light emitting device, the method comprising: forming a light emitting structure comprising a plurality of compound semiconductor layers on a substrate; discontinuously forming a plurality of fusion spots in the substrate by irradiating a laser light on the substrate along a chip boundary line of the light emitting structure; and separating an individual chip along the chip boundary line using the fusion spots of the substrate.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a substrate comprising a plurality of discontinuous fusion spots on at least one side surface thereof; and
a light emitting structure comprising a plurality of compound semiconductor layers on the substrate,
wherein the plurality of the discontinuous fusion spots is arranged having an interval of from about 7.5 μm to about 15 μm along the at least one side surface of the substrate, wherein at least one fusion spot of the substrate comprises at least one crack-like roughness branched from the fusion spot.

2. The semiconductor light emitting device of claim 1, wherein the plurality of discontinuous fusion spots is formed on two or all side surfaces of the substrate.

3. The semiconductor light emitting device of claim 1, wherein the fusion spot of the substrate is formed in a discontinuous dotted pattern.

4. The semiconductor light emitting device of claim 1, wherein the plurality of discontinuous fusion spots on the at least one side surface of the substrate occupies an area within about 15% of a total area of the at least one side surface of the substrate.

5. The semiconductor light emitting device of claim 1, wherein the substrate is formed of a transparent material, and has a thickness of from about 100 μm to about 150 μm.

6. The semiconductor light emitting device of claim 1, wherein the plurality of discontinuous fusion spots formed on the at least one side surface of the substrate is formed in a range from about 30% to 70% from the upper end or the lower end of the side surface of the substrate.

7. The semiconductor light emitting device of claim 1, wherein the plurality of discontinuous fusion spots formed on the at least one side surface of the substrate is formed in a discontinuous dotted pattern around at least one of the lower end, the center, and the upper end of the at least one side surface of the substrate.

8. The semiconductor light emitting device of claim 1, wherein the light emitting structure comprises at least one of an N-P junction, a P-N junction, an N-P-N junction and a P-N-P junction.

9. The semiconductor light emitting device of claim 1, wherein at least one of group II to VI compound semiconductor layers is interposed between the substrate and the light emitting structure.

10. A semiconductor light emitting device comprising:
a substrate comprising a plurality of discontinuous fusion spots arranged at a predetermined interval on at least one side surface thereof; and
a plurality of compound semiconductor layers on the substrate,
wherein the plurality of the discontinuous fusion spots is arranged having an interval of from about 7.5 μm to about 15 μm along the at least one side surface of the substrate.

11. The semiconductor light emitting device of claim 10, wherein the plurality of discontinuous fusion spots is formed on two or all side surfaces of the substrate, and some fusion spots of the plurality of discontinuous fusion spots comprise irregular cracks.

12. The semiconductor light emitting device of claim 10, wherein the plurality of discontinuous fusion spots on the at least one side surface of the substrate occupies an area within about 15% of a total area of the at least one side surface of the substrate.

13. The semiconductor light emitting device of claim 10, wherein the plurality of discontinuous fusion spots is arranged in a discontinuous dotted pattern along two or all side surfaces of the substrate.

14. The semiconductor light emitting device of claim 10, wherein the substrate comprises $Al_2O_3$ or glass.

15. The semiconductor light emitting device of claim 10, wherein the plurality of discontinuous fusion spots is formed around the center of the at least one side surface of the substrate.

16. The semiconductor light emitting device of claim 10, wherein the plurality of discontinuous fusion spots is formed at the lower end and the center of the at least one side surface of the substrate.

17. The semiconductor light emitting device of claim 10, wherein the plurality of compound semiconductor layers comprises a first conductive semiconductor layer, an active layer, and a second conductive semiconductor layer.

18. A semiconductor light emitting device comprising:

a substrate comprising a plurality of discontinuous fusion spots comprising a dotted pattern on at least one side surface thereof; and a light emitting structure comprising a plurality of compound semiconductor layers on the substrate, wherein the plurality of the discontinuous fusion spots is arranged having an interval of from about 7.5 μm to about 15 μm along the at least one side surface of the substrate, and wherein at least one fusion spot of the substrate comprises at least one crack-like roughness branched from the fusion spot.

* * * * *